US012310164B2

(12) United States Patent
Ueta

(10) Patent No.: US 12,310,164 B2
(45) Date of Patent: May 20, 2025

(54) LIGHT-EMITTING ELEMENT INCLUDING LUMINOUS QUANTUM DOTS AND NON-LUMINOUS QUANTUM DOTS, DISPLAY DEVICE INCLUDING LIGHT-EMITTING ELEMENT THEREOF, AND METHOD OF MANUFACTURING LIGHT- EMITTING ELEMENT THEREOF

(71) Applicant: SHARP KABUSHIKI KAISHA, Sakai (JP)

(72) Inventor: Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 743 days.

(21) Appl. No.: 17/602,996

(22) PCT Filed: Apr. 12, 2019

(86) PCT No.: PCT/JP2019/015979
§ 371 (c)(1),
(2) Date: Oct. 11, 2021

(87) PCT Pub. No.: WO2020/208810
PCT Pub. Date: Oct. 15, 2020

(65) Prior Publication Data
US 2022/0115613 A1 Apr. 14, 2022

(51) Int. Cl.
*H10K 50/115* (2023.01)
*H10K 59/122* (2023.01)
(Continued)

(52) U.S. Cl.
CPC ........... *H10K 50/115* (2023.02); *H10K 71/00* (2023.02); *H10K 59/122* (2023.02); *H10K 71/40* (2023.02);
(Continued)

(58) Field of Classification Search
CPC .... H10K 50/115; H10K 71/00; H10K 59/122; H10K 2102/321; H10K 2102/351;
(Continued)

(56) References Cited

U.S. PATENT DOCUMENTS 5,537,000 A * 7/1996 Alivisatos ............. B82Y 30/00
313/499
7,651,674 B2 * 1/2010 Jun ...................... C09K 11/565
977/773
(Continued)

FOREIGN PATENT DOCUMENTS

| JP | 2010-199067 A | 9/2010 |
|----|---------------|--------|
| JP | 2012-023388 A | 2/2012 |
| WO | 2011/148791 A1 | 12/2011 |

*Primary Examiner* — Caleb E Henry
(74) *Attorney, Agent, or Firm* — ScienBiziP, P.C.

(57) ABSTRACT

A technique is provided that improves the efficiency of electron and hole injection in a light-emitting element containing quantum dots in a light-emitting layer thereof and hence improves the luminous efficiency thereof. The light-emitting element includes on a substrate: a positive electrode; a negative electrode; a quantum-dot layer between the positive electrode and the negative electrode, the quantum-dot layer including a stack of a plurality of luminous, first quantum dots and a plurality of non-luminous, second quantum dots; a hole transport layer between the positive electrode and the quantum-dot layer; and an electron transport layer between the negative electrode and the quantum-dot layer, the plurality of second quantum dots being more numerous in an electron transport layer side than in a hole transport layer side.

10 Claims, 6 Drawing Sheets

(51) Int. Cl.
   *H10K 71/00* (2023.01)
   *H10K 71/40* (2023.01)
   *H10K 102/00* (2023.01)
(52) U.S. Cl.
   CPC . *H10K 2102/321* (2023.02); *H10K 2102/351* (2023.02)
(58) Field of Classification Search
   CPC ...... H10K 2101/80; H10K 71/40; G09F 9/30; H05B 33/10; H05B 33/14
   See application file for complete search history.

(56) References Cited

U.S. PATENT DOCUMENTS

| | | | | |
|---|---|---|---|---|
| 9,478,182 | B2* | 10/2016 | Whitehead | G09G 3/32 |
| 9,812,004 | B1* | 11/2017 | Boshernitzan | G08C 17/02 |
| 9,831,706 | B2* | 11/2017 | MacWilliams | H02J 7/32 |
| 9,874,693 | B2* | 1/2018 | Baiocco | H01L 21/762 |
| 10,600,980 | B1* | 3/2020 | Boardman | H10K 59/877 |
| 10,749,130 | B2* | 8/2020 | Kim | H10K 50/805 |
| 11,133,438 | B2* | 9/2021 | Boardman | H01L 33/387 |
| 2006/0039850 | A1* | 2/2006 | Jun | C09K 11/08 |
| | | | | 423/561.1 |
| 2006/0043361 | A1* | 3/2006 | Lee | H10K 50/125 |
| | | | | 313/504 |
| 2007/0103068 | A1* | 5/2007 | Bawendi | H10K 50/115 |
| | | | | 313/506 |
| 2008/0291141 | A1* | 11/2008 | Hillis | G09F 9/33 |
| | | | | 345/84 |
| 2010/0140586 | A1* | 6/2010 | Char | C09K 11/883 |
| | | | | 257/14 |
| 2010/0213438 | A1* | 8/2010 | Cho | H10K 50/156 |
| | | | | 438/47 |
| 2012/0155060 | A1* | 6/2012 | Ninan | G09G 3/001 |
| | | | | 362/84 |
| 2012/0238047 | A1 | 9/2012 | Bawendi et al. | |
| 2012/0280345 | A1* | 11/2012 | Zhu | G02B 6/1226 |
| | | | | 257/E31.127 |
| 2012/0292595 | A1 | 11/2012 | Bawendi et al. | |
| 2013/0037778 | A1* | 2/2013 | Kazlas | C09K 11/883 |
| | | | | 257/E29.024 |
| 2013/0069036 | A1* | 3/2013 | Miyata | C09K 11/565 |
| | | | | 438/35 |
| 2013/0146838 | A1* | 6/2013 | Ku | H01L 29/127 |
| | | | | 257/13 |
| 2014/0027816 | A1* | 1/2014 | Cea | H01L 29/1054 |
| | | | | 257/E29.085 |
| 2014/0197507 | A1* | 7/2014 | Assefa | H01L 31/0745 |
| | | | | 438/69 |
| 2015/0091093 | A1* | 4/2015 | Bouche | H01L 29/45 |
| | | | | 257/369 |
| 2015/0268417 | A1* | 9/2015 | Assefa | H01L 27/1461 |
| | | | | 385/14 |
| 2016/0027848 | A1* | 1/2016 | Liu | H10K 59/38 |
| | | | | 257/40 |
| 2016/0053948 | A1* | 2/2016 | Wang | F21S 4/28 |
| | | | | 362/249.06 |
| 2016/0327729 | A1* | 11/2016 | Patterson | G06F 3/041 |
| 2017/0125635 | A1 | 5/2017 | Bawendi et al. | |
| 2018/0156967 | A1* | 6/2018 | Lee | G02B 6/0026 |
| 2018/0254421 | A1* | 9/2018 | Kinge | H10K 30/35 |
| 2018/0309078 | A1* | 10/2018 | Ju | H10K 71/421 |
| 2018/0351125 | A1* | 12/2018 | He | H10K 50/16 |
| 2019/0288230 | A1* | 9/2019 | Kim | H10K 50/15 |
| 2023/0105598 | A1* | 4/2023 | Kim | H10K 59/38 |
| | | | | 257/40 |
| 2023/0139500 | A1* | 5/2023 | Kim | G02F 1/133617 |
| | | | | 362/84 |
| 2023/0192975 | A1* | 6/2023 | Wang | C08K 3/30 |
| | | | | 428/220 |

* cited by examiner

FIG.5

| CHARACTERISTIC PARAMETER | UNIT | MEASURED VALUE |
|---|---|---|
| $V_{th}$ | V | 3.3 |
| $V_l$ | V | 3.5 |
| $L_{max}$ | $cd/m^2$ | 50000 |
| $J_{max}$ | $ma/cm^2$ | 300 |
| $EQE_{max}$ | % | 18 |

FIG.6

| CHARACTERISTIC PARAMETER | UNIT | MEASURED VALUE |
|---|---|---|
| $V_{th}$ | V | 3 |
| $V_l$ | V | 3.5 |
| $L_{max}$ | $cd/m^2$ | 50000 |
| $J_{max}$ | $ma/cm^2$ | 500 |
| $EQE_{max}$ | % | 10 |

LIGHT-EMITTING ELEMENT INCLUDING LUMINOUS QUANTUM DOTS AND NON-LUMINOUS QUANTUM DOTS, DISPLAY DEVICE INCLUDING LIGHT-EMITTING ELEMENT THEREOF, AND METHOD OF MANUFACTURING LIGHT- EMITTING ELEMENT THEREOF

TECHNICAL FIELD

The present invention relates to light-emitting elements, display devices, and methods of manufacturing light-emitting elements.

BACKGROUND ART

Patent Literature 1, as an example, discloses a light-emitting element containing semiconductor nanocrystals and an inorganic substance in a light-emitting layer and a charge transport layer thereof.

CITATION LIST

Patent Literature

Patent Literature 1: Japanese Unexamined Patent Application Publication, Tokukai, No. 2012-23388

SUMMARY OF INVENTION

Technical Problem

There is room for improvement in the luminous efficiency of the light-emitting element disclosed in Patent Literature 1 if electrons and holes are efficiently injected to the light-emitting layer.

The present invention, in an aspect thereof has an object to provide a technique of improving the luminous efficiency of a light-emitting element containing quantum dots, by efficiently injecting electrons and holes to a light-emitting layer thereof.

Solution to Problem

To accomplish this object, the present invention, in an aspect thereof, is directed to a light-emitting element including on a substrate: a positive electrode; a negative electrode; a quantum-dot layer between the positive electrode and the negative electrode, the quantum-dot layer including a stack of a plurality of luminous, first quantum dots and a plurality of non-luminous, second quantum dots; a hole transport layer between the positive electrode and the quantum-dot layer; and an electron transport layer between the negative electrode and the quantum-dot layer, the plurality of second quantum dots being more numerous in an electron transport layer side than in a hole transport layer side.

To accomplish the object, the present invention, in another aspect thereof, is directed to a method of manufacturing a light-emitting element, the method including: forming a positive electrode on a substrate; forming a negative electrode on the substrate; forming a quantum-dot layer between the positive electrode and the negative electrode on the substrate, the quantum-dot layer including a stack of a plurality of luminous, first quantum dots and a plurality of non-luminous, second quantum dots; forming a hole transport layer between the positive electrode and the quantum-dot layer on the substrate; and forming an electron transport layer between the negative electrode and the quantum-dot layer on the substrate, the plurality of second quantum dots being more numerous in an electron transport layer side than in a hole transport layer side.

Advantageous Effects of Invention

The present invention, in an embodiment thereof, can achieve efficient injection of electrons and holes in a light-emitting element containing quantum dots in a light-emitting layer thereof and hence improve the luminous efficiency of the light-emitting element containing quantum dots in the light-emitting layer thereof.

BRIEF DESCRIPTION OF DRAWINGS

FIG. 5 shows device properties of the light-emitting element in accordance with the first embodiment.

FIG. 6 shows device properties of a light-emitting element in accordance with a comparative example.

DESCRIPTION OF EMBODIMENTS

Figure 1:
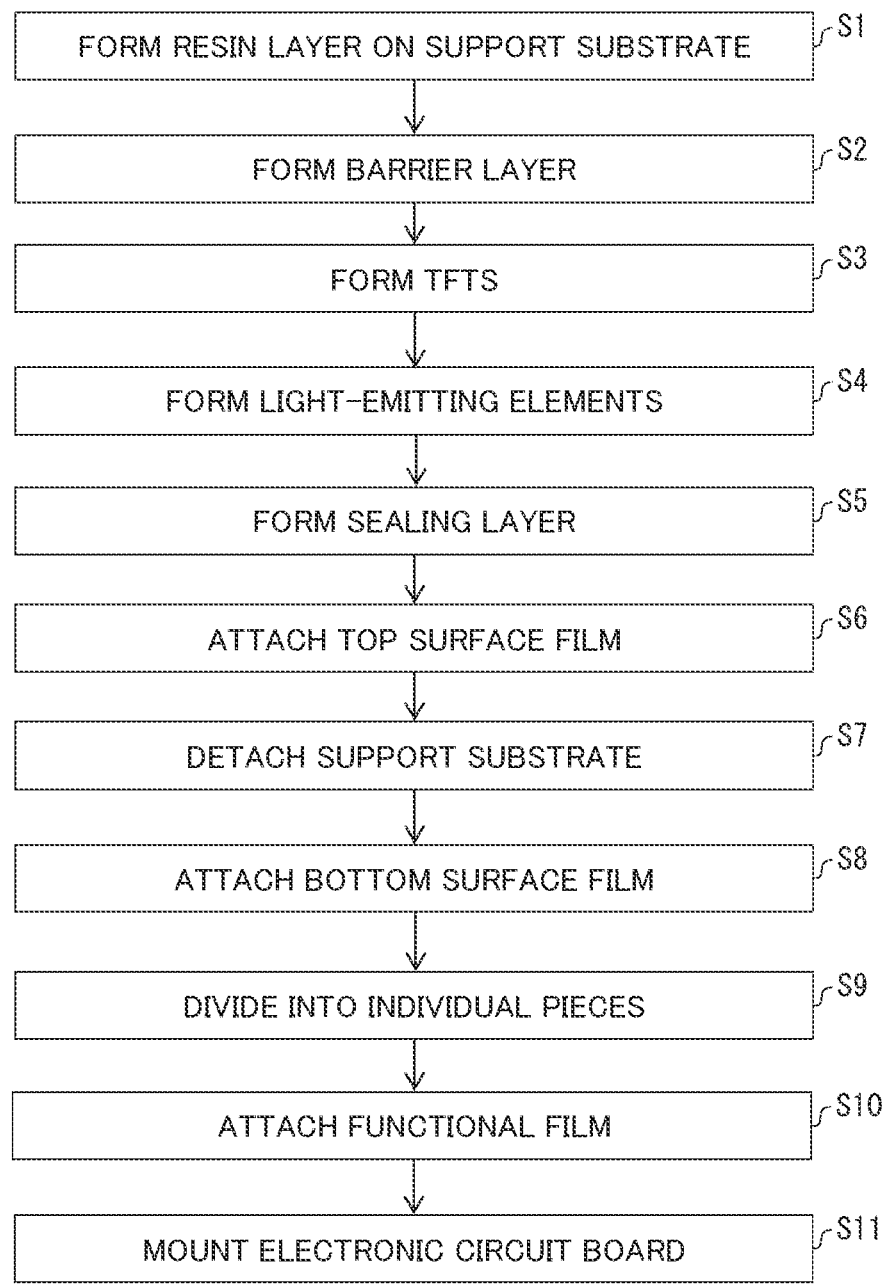
FIG. 1 is a flow chart representing an exemplary method of manufacturing a display device including light-emitting elements in accordance with a first embodiment.

The following will describe illustrative embodiments of the present invention in reference to drawings. Throughout the following description, expressions like "component A is in the same layer as component B" indicate that components A and B are formed in a single process or step (film forming step), expressions like "component A underlies/is below component B" indicate that component A is formed in an earlier process or step than component B, and expressions like "component A overlies/is on or above component B" indicate that component A is formed in a later process or step than component B, The same reference numerals in the drawings denote identical or equivalent members, and their description is omitted.

First Embodiment

Figure 2:
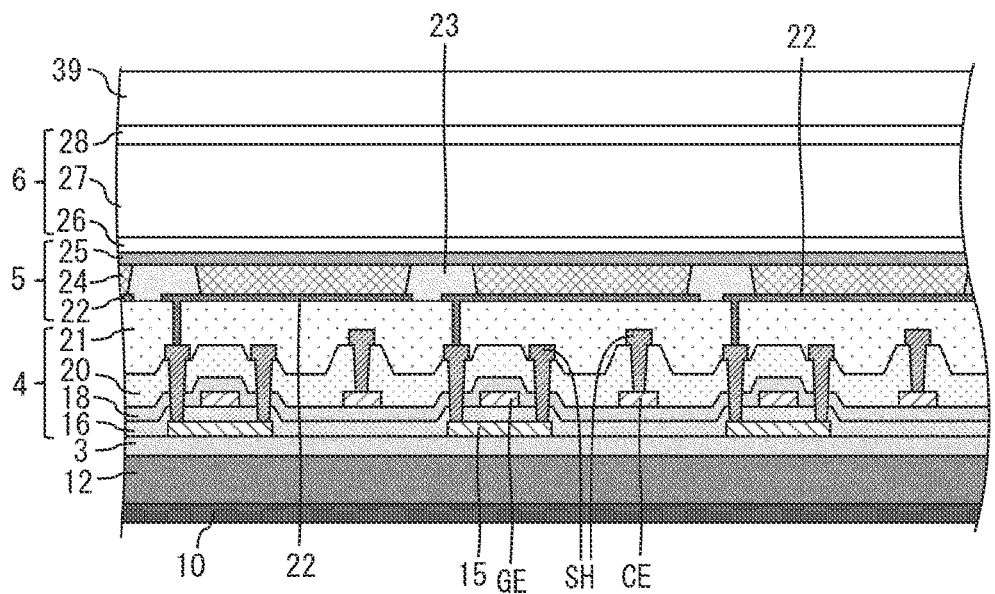
FIG. 2 is a cross-sectional view of an exemplary structure of a display device including the light-emitting elements in accordance with the first embodiment.

FIG. 1 is a flow chart representing an exemplary method of manufacturing a display device 1 including light-emitting elements 5 in accordance with the present embodiment. FIG. 2 is a cross-sectional view of the display device 1 including the light-emitting elements 5 in accordance with the present embodiment.

The display device 1 in accordance with the present embodiment is a QLED (quantum-dot light-emitting diode) panel in which the light-emitting elements 5 containing quantum dots 70 are provided on a resin layer 12 that is a flexible substrate. The display device 1 may alternatively be structured such that the light-emitting elements 5 are provided on a rigid substrate such as a glass substrate.

To manufacture the display device 1, first, the resin layer 12 is formed on a transparent support substrate (e.g., mother glass) as shown in FIGS. 1 and 2 (step S1). Next, a barrier layer 3 is formed (step S2). Thin film transistors (TFTs) 4 are then formed (step S3). Next, the top-emission light-emitting elements 5 are formed (step S4). Subsequently, a sealing layer 6 is formed (step S5). A top surface film is then attached to the sealing layer 6 (step S6).

Next, the support substrate is detached from the resin layer 12 by laser irradiation (step S7). Next, a bottom face film 10 is attached to the bottom face of the resin layer 12 (step S8). Next, a stack body of the bottom face film 10, the resin layer 12, the barrier layer 3, the TFTs 4, the light-emitting elements 5, and the sealing layer 6 is divided to obtain individual pieces (step S9). Next, a functional film 39 is attached to the resultant individual pieces (step S10). Next, an electronic circuit board (e.g., an IC chip and an FPC) is mounted to a portion (terminal section) outside a display area where there is provided a plurality of subpixels (a non-display area or a frame) (step S11). Steps S1 to S11 are carried out by a manufacturing machine for the display device 1 (including a film-forming machine for steps S1 to S5). A method of manufacturing the light-emitting elements 5 will be described later in detail.

The resin layer 12 is made of, for example, polyimide. The resin layer 12 may be replaced by a combination of two resin films e.g., polyimide films) and an inorganic insulation film interposed between these two resin films The barrier layer 3 prevents foreign materials such as water and oxygen from reaching the TFTs 4 and the light-emitting elements 5. The barrier layer 3 may include, for example, a silicon oxide film, a silicon nitride film, a silicon oxynitride film, or a stack of these films. The films can be formed by CVD.

Each TFT 4 includes: a semiconductor film 15; an inorganic insulation film 16 (gate insulation film) overlying the semiconductor film 15; a gate electrode GE and a gate line (not shown) connected to the gate electrode both overlying the inorganic insulation film 16; an inorganic insulation film 18 overlying the gate electrode GE and the gate line; a capacitor electrode CE overlying the inorganic insulation film 18; an inorganic insulation film 20 overlying the capacitor electrode CE; a source line SH overlying the inorganic insulation film 20; and a planarization film 21 (interlayer insulation film) overlying the source line SH.

The semiconductor film 15 is made of, for example, a low-temperature polysilicon (LIPS) or an oxide semiconductor (e.g., In—Ga—Zn—O-based semiconductor). The TFT 4 is structured so as to contain the semiconductor film 15 and the gate electrode GE. FIG. 2 shows an example where the TFT 4 has a top-gate structure. Alternatively, the TFT 4 may have a bottom-gate structure.

The gate electrodes GE, the gate lines, the capacitor electrodes Cl, and the source lines SH are made of, for example, a monolayer or multilayered film of at least one of metals of aluminum, tungsten, molybdenum, tantalum, chromium, titanium, and copper. In the example of FIG. 2, the TFT 4 includes a single semiconductor layer and three metal layers.

The inorganic insulation films 16, 18, and 20 may be made of, for example, a silicon oxide ($SiO_x$) film or a silicon nitride ($SiN_x$) film formed by CVD or a stack of these films. The planarization film 21 is a resin layer that can be made of, for example, an organic material, such as polyimide or acrylic, that can be provided by printing or coating technology.

The light-emitting; element 5 includes, for example, a positive electrode 22 overlying the planarization film 21, an insulating cover film 23 covering an edge of the positive electrode 22, a functional layer 24 overlying the cover film 23, and a negative electrode 25 overlying the functional layer 24. The cover film 23 is formed, for example, by patterning an applied organic material such as polyimide or acrylic by photolithography. The light-emitting element 5 including the insular positive electrode 22, the functional layer 24, and the negative electrode 25 is provided for each subpixel. A subpixel circuit is formed in the TFT 4 to control the light-emitting element 5. The functional layer 24 in accordance with the present embodiment includes a hole transport layer 241, a quantum-dot layer 242, and an electron transport layer 243. The hole transport layer 241, the quantum-dot layer 242, and the electron transport layer 243 will be described later in detail.

The sealing layer 6 is transparent and includes, for example: an inorganic sealing film 26 covering the negative electrode 25; an organic layer including an organic buffer film 27 overlying the inorganic sealing film 26; and an inorganic sealing film 28 overlying the organic buffer film 27. The sealing layer 6, coven rig the light-emitting element 5, prevents foreign materials such as water and oxygen from reaching the light-emitting element 5.

The inorganic sealing film 26 and the inorganic sealing film 28 are inorganic insulation films and may each include, for example, a silicon oxide film, a silicon nitride film, a silicon oxynitride film, or a stack of these films. The films can be formed by CND, The organic buffer film 27 is a transparent organic film that has a planarization effect. The organic buffer film 27 may be made of an organic material, such as acrylic, that can be provided by printing or coating technology. The organic buffer film 27 may be formed, for example, by inkjet printing. There may be provided a bank in the non-display area to stop liquid drops.

The bottom face film 10 is, for example, a PET film attached to the bottom face of the resin layer 12 after the support substrate is detached, so that the resultant light-emitting element is highly flexible. The functional film 39 has, for example, at least one of an optical compensation function, a touch sensor function, and a protection function.

The description has so far focused on the flexible display device 1. To manufacture a non-flexible display device, for example, stacking steps S2 to S5 are carried out on a glass substrate before the manufacturing process proceeds to step S9, because it is generally unnecessary to form a resin layer and reattach base members.

Figure 3:
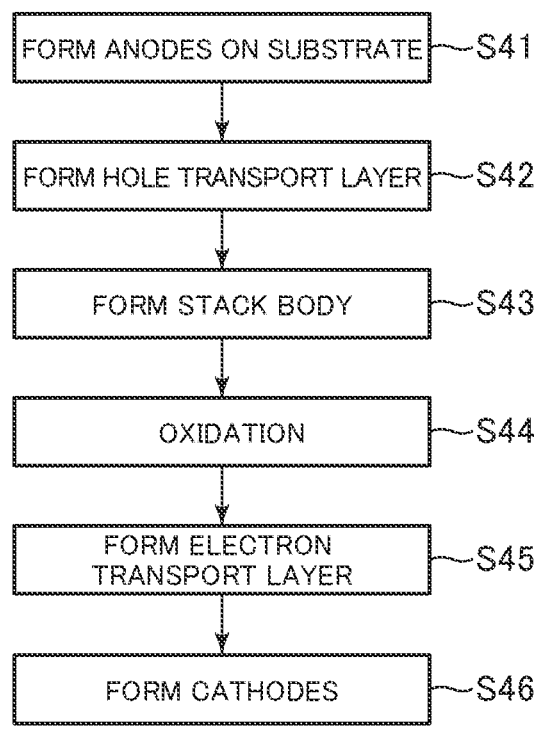
FIG. 3 is a flow chart representing an exemplary method of manufacturing the light-emitting elements in accordance with the first embodiment.
Figure 4:
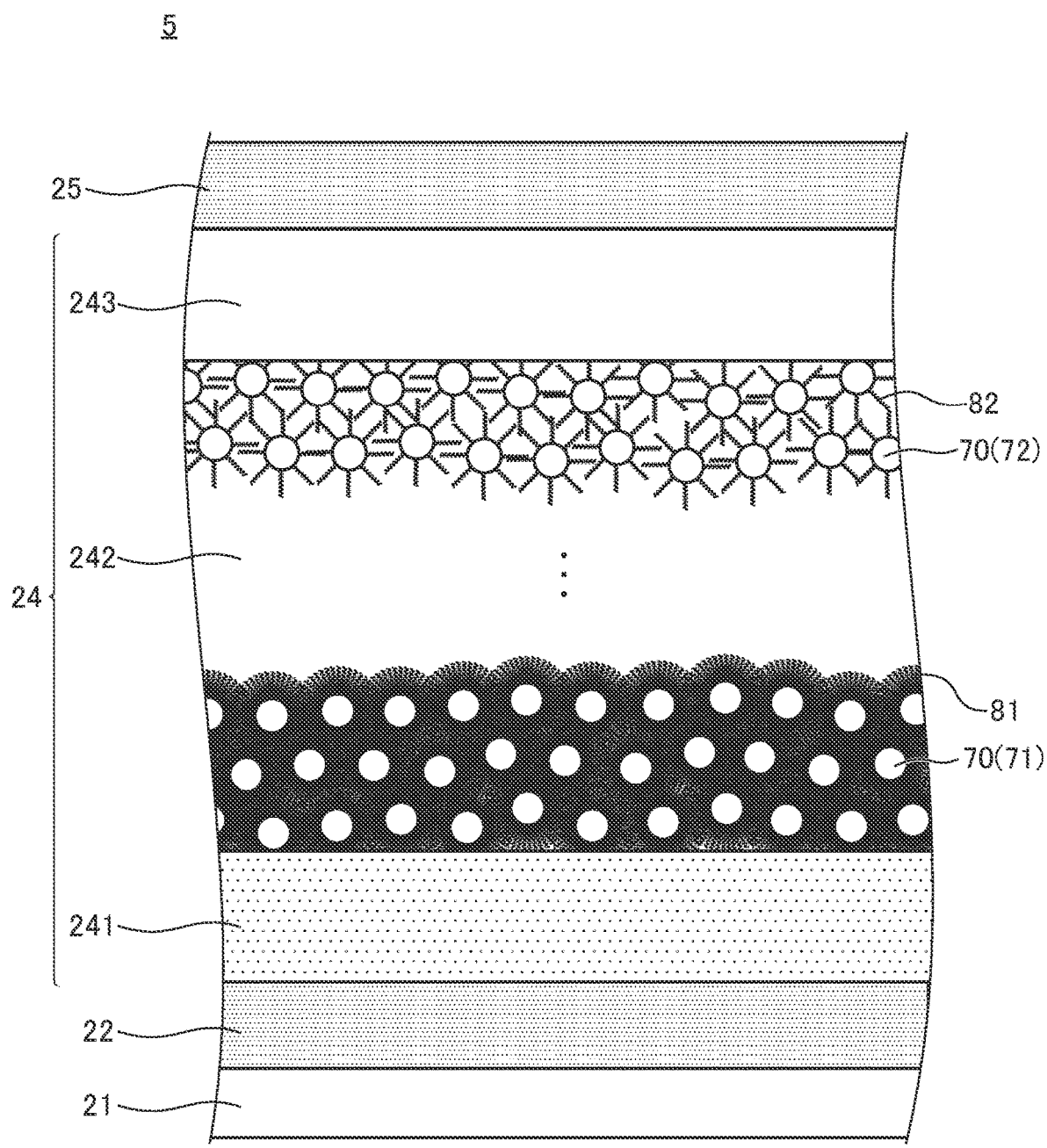
FIG. 4 is a cross-sectional view of an exemplary structure of a light-emitting element in accordance with the first embodiment.

A description is now given of a method of manufacturing the light-emitting elements 5 and the structure of the light-emitting elements 5. FIG. 3 is a flow chart representing an exemplary method of manufacturing the light-emitting elements 5 in accordance with the present embodiment. FIG. 4 is a schematic cross-sectional view of the structure of the light-emitting elements 5 in accordance with the present embodiment.

A method of manufacturing the light-emitting elements 5 in accordance with the present embodiment includes: a step of forming the positive electrodes 22 on a substrate (step S41); a step of forming the hole transport layer 241 (step S42); a step of forming a stack body (step S43); a step of oxidation (step S44); a step of forming the electron transport layer 243 (step S45); and a step of forming the negative electrodes 25 (step S46).

Specifically, to manufacture the light-emitting elements 5 in accordance with the present embodiment, the positive electrodes 22 are formed first on the plananzation film 21 on the resin layer 12 (substrate) as shown in FIGS. 3 and 4 (step S41). The positive electrodes 22 are formed by, for example, sputtering or vapor deposition. The positive electrodes 22 are made of, for example, a stack of ITO (indium tin oxide) and either Ag or a Ag-containing alloy so that the positive electrodes 22 can reflect light. The positive electrodes 22 may alternatively be made of a metal such as Al, Cu, Au, or Ag or an alloy containing at least one of these metals. As another alternative, the positive electrodes 22 may be made of a stack of such an alloy and ITO.

Next, the hole transport layer 241 is formed on the positive electrodes 22 (step S42). The hole transport layer 241 is formed by, for example, sputtering or vapor deposition. The hole transport layer 241 is made of, for example, a film of metal oxide such as NiO, $Cr_2O_3$, MgO, MgZnO, $LaNiO_3$, $MoO_3$, or $WO_3$. The hole transport layer 241 may alternatively be made of an organic film such as PEDOT-PSS, PVK, or TFB. In such an alternative, the hole transport layer 241 may be formed by inkjet technology.

Next, a stack body including a stack of quantum dots 70 is formed on the hole transport layer 241 (step S43). The stack body is formed by, for example, applying, using inkjet technology, a colloidal solution prepared by dispersing the quantum dots 70 in an organic solvent such as hexane or toluene. The colloidal solution may additionally contain a dispersant such as thiol or amine, which facilitates the dispersion of the quantum dots 70 in the colloidal solution.

Each quantum dot 70 has a valence band and a conduction band and emits light because of recombination of holes occupying the top of the valence band and electrons occupying the bottom of the conduction band. The light emitted by the quantum dot 70 has a narrow spectrum due to the three-dimensional quantum confinement effect and hence exhibits deep chromaticity. The quantum dot 70 in accordance with the present embodiment includes ligands forming the outermost layer. Specifically, the quantum dot 70 in accordance with the present embodiment includes, for example, a core, a shell covering the core, and a plurality of ligands formed on the outer surface of the shell. The core of the quantum dot 70 is made of, for example, CdSe, InP, ZnSe, or CIGS (a compound formed primarily of copper, indium, gallium, and selenium). The shell of the quantum dot 70 is made of, for example, ZnS. The ligand is made of, for example, a linear or branched alkyl group that may include a heteroatom.

Next, an oxidation process is performed (step S44). The oxidation is performed by, for example, heating the stack body in an atmosphere of a prescribed oxygen concentration after the stack body is formed. The oxygen concentration is, for example, 5% in the oxidation in accordance with the present embodiment. Of the ligands on the quantum dots 70 in the stack body, those on the quantum dots 70 residing near the negative electrode 25 (shown near the top in FIGS. 2 and 4) are oxidized in the oxidation. In contrast, those on the quantum dots 70 residing near the positive electrodes 22 (shown near the bottom in FIGS. 2 and 4) are not affected by the oxidation process. Hence, the resultant quantum-dot layer 242 includes: first quantum dots 71 that are those quantum dots 70 which have not been affected by the oxidation process; and second quantum dots 72 that are those quantum dots 70 which have been affected by the oxidation process. The first quantum dots 71 and the second quantum dots 72 will be described later in detail.

Next, the electron transport layer 243 is formed on the quantum-dot layer 242 (step S45). The electron transport layer 243 is formed by, for example, sputtering, vapor deposition, or coating. The electron transport layer 243 includes, for example, a film of a metal oxide such as $TiO_2$, ZnO, ZAO (aluminum-added ZnO), ZnMgO, ITO, or IGZO® ($InGaZnO_x$). The electron transport layer 243 may alternatively include, for example, a conductive polymer such as $Alq_3$, BCP, or t-Bu-PBD.

As an example, to manufacture the electron transport layer 243 in accordance with the present embodiment, first, a colloidal solution in which $TiO_2$ nanoparticles are dispersed in a medium is prepared. The colloidal solution is then applied to the quantum-dot layer 242 by inkjet technology and the medium in the colloidal solution is heated and hence vaporized. The electron transport layer 243 of $TiO_2$ is hence formed on the quantum-dot layer 242. Alternatively, a resist in which $TiO_2$ nanoparticles are dispersed may be used in place of the colloidal solution in which $TiO_2$ nanoparticles are dispersed. As another alternative, another coating technique such as spin-coating or spraying may be used in place of inkjet technology. The electron transport layer 243 may be formed by sputtering using a $TiO_2$ target. The electron transport layer 243 may be formed by reactive sputtering using a Ti target and oxygen. The electron transport layer 243 may be formed by applying and subsequently heating a $TiO_2$ precursor or a solution containing a $TiO_2$ precursor.

Thereafter, the negative electrodes 25 are formed on the electron transport layer 243 (step S46). The negative electrodes 25 are formed by, for example, sputtering or vapor deposition. The negative electrodes 25 include, for example, transparent electrodes. The negative electrodes 25 are made of, for example, a film of a metal oxide such as IGZO, ITO, or IZO. The negative electrodes 25 may alternatively be made of such a thin film of a metal such as Al or Ag that the negative electrodes 25 can transmit light.

The holes injected from the positive electrode 22 and the electrons injected from the negative electrode 25 move through a first ligand 81, which is one of ligands on the first quantum dot 71, and recombine in the core of the first quantum dot 71, which results in the first quantum dot 71 emitting light. The light-emitting elements 5 including the quantum dots 70 are formed in this manner. The light-emitting element 5 in accordance with the present embodiment is an example of a top-emission element where the light emitted by the quantum-dot layer 242 leaves the element through a side opposite from the substrate (through the top in FIGS. 2 and 4). Alternatively, the light-emitting element 5 may be a bottom-emission element where the light leaves the element through the substrate side (through the bottom in FIGS. 2 and 4), in which case the negative electrode 25 includes a reflective electrode made of Ag or a Ag-containing alloy, and the positive electrode 22 includes a transparent electrode, as an example.

The light-emitting element 5 in accordance with the present embodiment includes, on the substrate: the positive electrode 22; the negative electrode 25; the quantum-dot layer 242 between the positive electrode 22 and the negative electrode 25; the hole transport layer 241 between the positive electrode 22 and the quantum-dot layer 242; and the electron transport layer 243 between the negative electrode 25 and the quantum-dot layer 242. Specifically, the light-emitting element 5 in accordance with the present embodiment includes the positive electrode 22, the hole transport layer 241, the quantum-dot layer 242, the electron transport layer 243, and the negative electrode 25, all stacked in this sequence when viewed from the substrate. Alternatively, the light-emitting element 5 may include the negative electrode 25, the electron transport layer 243, the quantum-dot layer 242, the hole transport layer 241, and the positive electrode 22, all stacked in this sequence when viewed from the substrate.

A description is given next of a structure of the quantum-dot layer 242. The quantum-dot layer 242 in accordance with the present embodiment is formed by stacking the quantum dots 70. The quantum dots 70 include the luminous, first quantum dots 71 and the non-luminous, second quantum dots 72.

As described earlier, the first quantum dots 71 are those quantum dots 70 which are not affected by the oxidation process. On the other hand, the second quantum dots 72 are those quantum dots 70 which are affected by the oxidation process. Carriers (holes and electrons) move less in second ligands 82 that are ligands on the second quantum dots 72 due to the oxidation. Accordingly, the second quantum dots 72 have a lower conductivity than the first quantum dots 71. In other words, the second quantum dots 72 have a higher resistivity than the quantum dots 71. The first quantum dots 71 have a resistivity of, for example, 0.1 Ω·cm or lower. The second quantum dots 72 have a resistivity of, for example, 10 Ω·cm or higher. The second quantum dots 72 therefore disrupt the transport of holes and electrons. The second quantum dots 72 thereby disrupt the recombination of holes and electrons therein and do not emit light. The terms, "not emit light" and "non-luminous," are used comprehensively to indicate that the member under consideration exhibits a much lower light-emission luminance than the first quantum dots 71 (e.g., 36% or less of the light-emission luminance of the first quantum dots 71).

The conductivity of the first quantum dots 71 and the second quantum dots 72 can be determined, for example, by EBIC (electron beam induced current) measurement on a region containing the second quantum dots 72. ERIC measurement is a technique to measure a minute current of carriers generated in a sample by an electron beam. The carriers generated in the quantum-dot layer 242 under electron beam radiation are transported from the quantum-dot layer 242 to the electron transport layer 243 and the hole transport layer 241 by a built-in electric field generated when Fermi levels match between the quantum-dot layer 242 and the electron transport layer 243 and between the quantum-dot layer 242 and the hole transport layer 241, This transport of carries produces a minute current. The conductivity can be determined by measuring the minute current and comparing a region containing the first quantum dots 71 and a region containing the second quantum dots 72.

The second quantum dots 72 in accordance with the present embodiment are more numerous in an electron transport layer 243 side than in a hole transport layer 241 side. For instance, at least some of the second quantum dots 72 are in contact with the electron transport layer 243 because those quantum dots 70 in the quantum-dot layer 242 which are present on the front side (the negative electrode 25 side, the top side in FIGS. 2 and 3) are more likely to be affected by the oxidation process.

In the present embodiment, the first ligand 81 includes as many carbon atoms per molecule thereof as does the second ligand 82. In other words, the first ligand 81 includes the same main component as does the second ligand 82. The first ligands 81 on the first quantum dot 71 however have a different weight than do the second ligands 82 on the second quantum dot 72. For instance, the first ligands 81 on the single first quantum dot 71 have a larger weight than do the second ligands 82 on the single second quantum dot 72. This is a result of the oxidation process removing some of the ligands on the second quantum dot 72. Accordingly, the second quantum dots 72 have a lower conductivity than the first quantum dots 71. The second quantum dots 72 therefore do not emit light.

It is inferred that the oxidation of the quantum-dot layer 242 proceeds in the following manner. The oxidation of the quantum-dot layer 242 proceeds due to diffusion of oxygen from the atmosphere outside the stack structure of the element and is therefore rate-controlled by the oxygen diffusion. The oxygen diffusion is driven by a concentration gradient a difference between the oxygen concentration in the atmosphere outside the stack structure of the element and the oxygen concentration in the stack structure of the element. Therefore, the oxygen diffusion distance in the thickness of the stack structure of the element is inferred to follow a diffusion equation. The diffusion equation, despite being a partial differential equation of time and location, can be analytically solved. The time-dependent terms in the diffusion equation follow the square root of the time taken by the diffusion distance to diffuse. For instance, in a semiconductor process, the thickness of the oxide film on the surface of a Si substrate is controlled through the square root of oxidation time. Likewise, in the present embodiment, the thickness of an oxidized region of the quantum-dot layer 242 is controlled through the square root with respect to oxygen diffusion time.

Since the multilayered structure of the light-emitting element 5 in the present embodiment is fabricated by coating, sputtering, and/or printing, each layer in the light-emitting element 5 has a thickness of a few tens of nanometers to a few hundreds of nanometers and is thinner than a counterpart in common semiconductor devices. Accordingly, the light-emitting element 5 has lower barrier properties against oxygen diffusion from outside the element. It may therefore be safely assumed that oxygen diffusion proceeds more quickly in the light-emitting element 5 than in a common semiconductor device. For instance, when the quantum-dot layer 242 is 50 nm thick, and the electron transport layer 243 and the negative electrodes 25 are 40 nm and 100 nm thick respectively, it takes about 300 seconds to render the quantum-dot layer 242 non-luminous by oxidizing the entire quantum-dot layer 242. It is therefore estimated that it takes 254 seconds to oxidize up to half the thickness of the quantum-dot layer 242.

The electrons injected from the negative electrode 25 are hindered by the second quantum dots 72 from moving into the quantum-dot layer 242. Excess electrons, which do not contribute to recombination, are therefore restrained from moving into the quantum-dot layer 242. Meanwhile, the holes injected from the positive electrode 22 move into the quantum-dot layer 242, but are hindered by the second quantum dots 72 from moving further into the negative electrode 25. The holes therefore accumulate in the quantum-dot layer 242. By this mechanism, the electrons injected from the negative electrode 25 and the holes injected from the positive electrode 22 efficiently recombine in the quantum-dot layer 242, which improves the charge-carrier balance between the electrons injected from the negative electrode 25 and the holes injected from the positive electrode 22 in the quantum-dot layer 242. The luminous efficiency of the light-emitting element 5 is hence improved.

The quantum-dot layer 242 in accordance with the present embodiment includes a light-emitting layer of first quantum dots 71 and a non-light-emitting layer of second quantum dots 72. This non-light-emitting layer is present in the hole transport layer 241 side rather than in the electron transport layer 243 side.

The quantum-dot layer 242 has a thickness of, for example, from 10 nm to 50 nm, both inclusive. The minimum thickness of the quantum-dot layer 242 is dictated by the sum of the particle diameter of the first quantum dots 71 and the particle diameter of the second quantum dots 72 because the quantum-dot layer 242 includes the light-emitting layer and the non-light-emitting layer along the thickness of the quantum-dot layer 242. The particle diameter of the first quantum dots 71 and the particle diameter of the second quantum dots 72 are dictated by emission wavelength. Specifically, the particle diameter of the first quantum dots 71 and the particle diameter of the second quantum dots 72 in the present embodiment decrease with a decrease in the wavelength of the light to be emitted by the dots, that is, from red to green to blue. More specifically, in the present embodiment, the quantum dots used to emit blue light, which has the shortest wavelength, have a particle diameter of approximately 5 nm. Accordingly, the minimum thickness of the quantum-dot layer 242 is preferably 10 nm. This particular structure allows for restraining the quantity of materials used in preparing the quantum-dot layer 242 including both a light-emitting layer and a non-light-emitting layer even when, for example, the quantum-dot layer 242 is formed of quantum dots with a particle diameter as small as 5 nm. In other words, this structure can improve the charge-carrier balance between the electrons injected from the negative electrode 25 and the holes injected from the positive electrode 22 in the quantum-dot layer 242, thereby improving the luminous efficiency of the light-emitting element 5.

If the non-light-emitting layer has a thickness larger than half the thickness of the quantum-dot layer 242, the luminous efficiency is not sufficiently improved because the greater non-luminous effect of the non-light-emitting layer exceeds the charge-carrier balance improving effect of the light-emitting layer in the quantum-dot layer 242. Therefore, the non-light-emitting layer preferably has a thickness not in excess of half the thickness of the quantum-dot layer 242. The minimum thickness of the non-light-emitting layer is preferably 5 nm as described earlier. This structure further improves the charge-carrier balance in the light-emitting layer in the quantum-dot layer 242, thereby achieving a further improvement of the luminous efficiency.

FIG. 5 shows device properties of the light-emitting element 5 in accordance with the present embodiment. FIG. 6 shows, as a comparative example, device properties of the light-emitting element 5 containing no second quantum dots 72 in the quantum-dot layer 242 thereof. In FIGS. 5 and 6, $V_{th}$ is a cut-in voltage for current in the current-voltage characteristics, $V_1$ is a cut-in voltage for luminance in the voltage-luminance characteristics, $L_{max}$, is a maximum light-emission luminance, $J_{max}$ is a current density at the maximum light-emission luminance, and $EQE_{max}$ is a maximum external quantum efficiency.

Referring to FIGS. 5 and 6, $J_{max}$ has a smaller value in the light-emitting element 5 in accordance with the present embodiment than in the light-emitting element 5 in accordance with the comparative example. $EQE_{max}$ has a greater value in the light-emitting element 5 in accordance with the present embodiment than in the light-emitting element 5 in accordance with the comparative example. These figures demonstrate that the luminous efficiency of the light-emitting element 5 in accordance with the present embodiment is improved over the luminous efficiency of the light-emitting element 5 in accordance with the comparative example.

The values of $V_1$ and $L_{max}$, of the light-emitting element 5 in accordance with the present embodiment are respectively equivalent to the values of $V_1$ and $L_{max}$ of the light-emitting element 5 in accordance with the comparative example, Meanwhile, the value of $V_{th}$ of the light-emitting element 5 in accordance with the present embodiment is greater by 0.3 volts and hence closer to the value of $V_1$ than the value of $V_{th}$ of the light-emitting element 5 in accordance with the comparative example. These figures demonstrate that in the light-emitting element 5 in accordance with the present embodiment, the presence of the second quantum dots 72 in the quantum-dot layer 242 suppresses the injection of the electrons that do not contribute to light emission, but does not change the injection of holes. In other words, the figures demonstrate that the charge-carrier balance between electrons and holes is improved in the light-emitting element 5 in accordance with the present embodiment.

Second Embodiment

A description is given next of a second embodiment. The description will focus on differences from the first embodiment; no description will be repeated on features thereof that are similar to those of the first embodiment.

Figure 7:
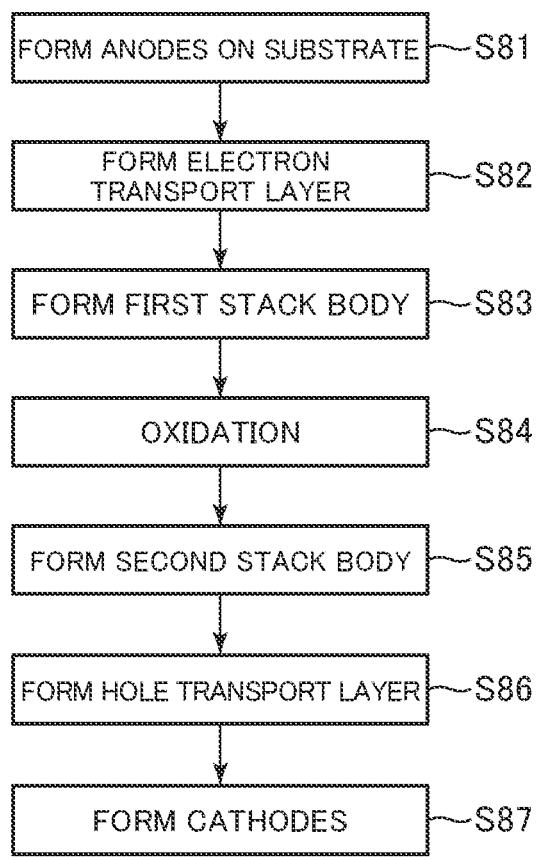
FIG. 7 is a flow chart representing an exemplary method of manufacturing light-emitting elements in accordance with a second embodiment.
Figure 8:
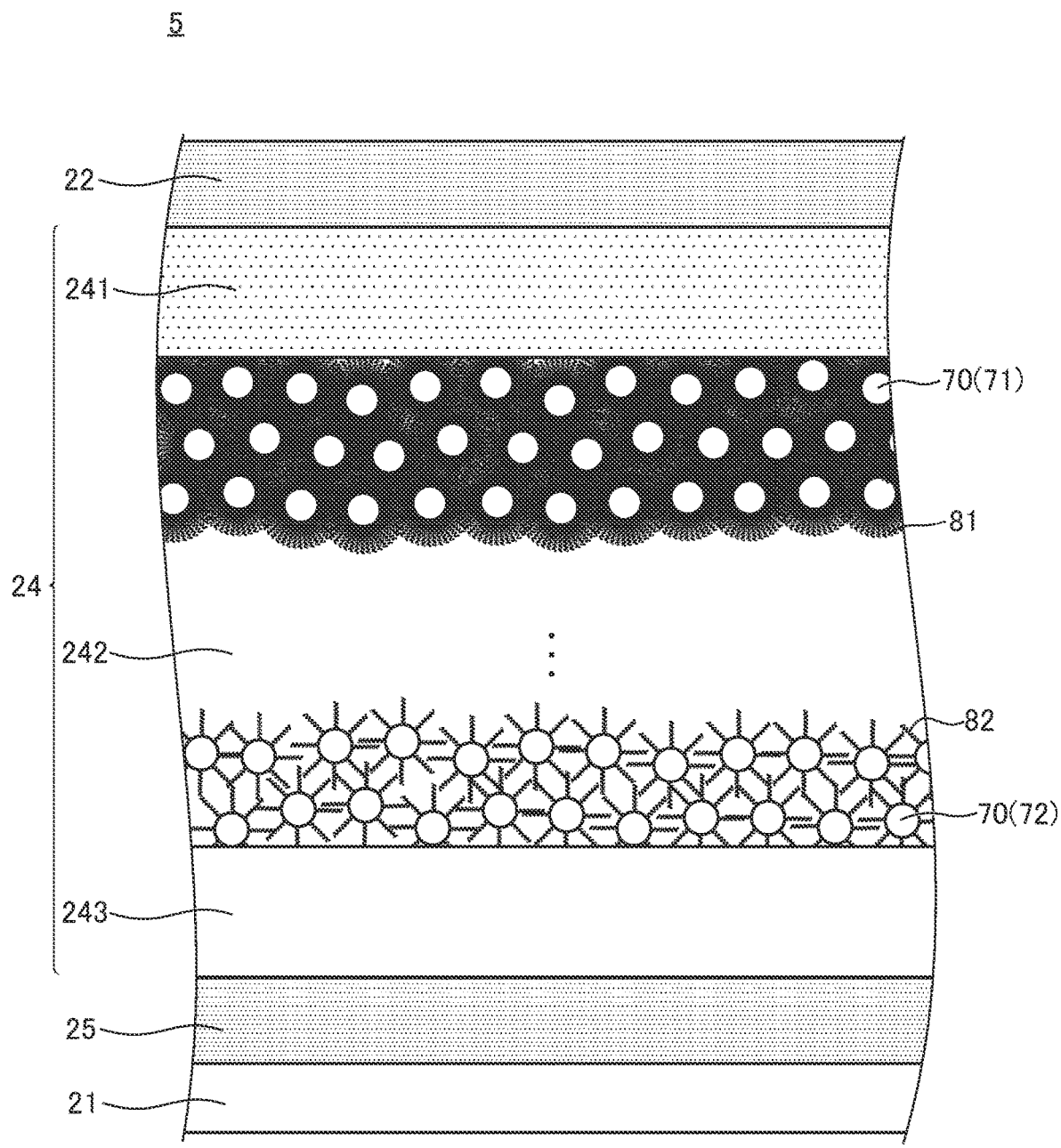
FIG. 8 is a cross-sectional view of an exemplary structure of a light-emitting element in accordance with the second embodiment.

FIG. 7 is a flow chart representing a method of manufacturing the light-emitting elements 5 in accordance with the present embodiment. FIG. 8 is a cross-sectional view of a structure of the light-emitting element 5 in accordance with the present embodiment.

A method of manufacturing the light-emitting elements 5 in accordance with the present embodiment includes: a step of forming negative electrodes 25 on a substrate (step S81); a step of forming an electron transport layer 243 (step S82); a step of forming a first stack body (step S83); a step of oxidation (step S84); a step of forming a second stack body (step S85); a step of forming a hole transport layer 241 (step S86); and a step of forming positive electrodes 22 (step S87).

Specifically, to manufacture the light-emitting elements 5 in accordance with the present embodiment, the negative electrodes 25 are formed first on the planarization film 21 on the resin layer 12 (substrate) as shown in FIGS. 7 and 8 (step S81). Next, the electron transport layer 243 is formed on the negative electrodes 25 (step S82). Steps S81 and S82 are respectively similar to steps S46 and S45 of the first embodiment, and description thereof is omitted.

Next, a first stack body including a plurality of quantum dots 70 is formed on the electron transport layer 243 (step S83). Next, an oxidation process is performed (step S84). These steps form a non-light-emitting layer of the second quantum dots 72 on the electron transport layer 243. Step S83 is performed similarly to step S43 of the first embodiment, such that the first stack body has a thickness of for example, not more than 30 nm. Step S84 is similar to step S44 of the first embodiment, and description thereof is omitted.

Next, a second stack body including a plurality of quantum dots 70 is formed on the non-light-emitting, layer of the second quantum dots 72 (step S85). Step S85 is performed similarly to step S43 of the first embodiment, such that the second stack body has a thickness of, for example, not more than 30 nm. These steps form a quantum-dot layer 242 including a stack of the first quantum dots 71 and the second quantum dots 72 on the electron transport layer 243.

Next, the hole transport layer 241 is formed on the quantum-dot layer 242 (step S86). Next, the positive electrodes 22 are formed on the hole transport layer 241 (step S87). Steps S86 and S87 are respectively similar to steps S42 and S41 of the first embodiment, and description thereof is omitted.

According to the method of manufacturing the light-emitting elements 5 in accordance with the present embodiment, the quantum-clot layer 242 is formed by stacking a plurality of stack bodies as described here. An oxidation process is only performed after the first stacking, not after the second stacking. The light-emitting element 5 in accordance with the present embodiment has a so-called inverted structure where the negative electrodes 25 are present on the substrate side (shown near the bottom in FIG. 8) and the positive electrodes 22 are present on a side opposite from the substrate (shown near the top in FIG. 8). Despite the light-emitting element 5 having an inverted structure, it is still possible to form the quantum-dot layer 242 including a non-light-emitting layer of the second quantum dots 72 in the electron transport layer 243 side. Hence, the charge-carrier balance between holes and electrons can be improved in the quantum-dot layer 242 in the light-emitting element 5 in accordance with the present embodiment, which in turn improves the luminous efficiency of the light-emitting element 5.

The light-emitting element 5 in accordance with the present embodiment may have either a top-emission structure or a bottom-emission structure. In a top-emission structure, the positive electrode 22 includes a transparent electrode, and the negative electrode 25 includes a reflective electrode. In a bottom-emission, the positive electrode 22 includes a reflective electrode, and the negative electrode 25 includes a transparent electrode.

VARIATION EXAMPLE

Primary embodiments of the present invention have been described so far. The present invention is not limited to these embodiments.

The oxidation process is carried out by heating in an oxygen atmosphere in the embodiments. The oxidation process of the present invention is not limited to this method. Alternatively, the oxidation process may be carried out, for example, by using oxygen, a halogen, a reactive oxygen species such as ozone, or an oxidizing gas. As another alternative, the oxidation process may be carried out by electron beam radiation, plasma radiation, or ultraviolet radiation.

The quantum-dot layer 242 is formed by stacking the quantum dots 70 and subsequently carrying out the oxidation process in the embodiments. Alternatively, the quantum-dot layer 242 may be formed by, for example, stacking non-luminous and luminous quantum dots separately without involving an oxidation process.

The oxidation process is carried out in the first embodiment after the stack body is formed that includes a stack of the quantum dots 70. Alternatively, the oxidation process may be carried out after the negative electrodes 25 are formed. This alternative technique can equally provide the quantum-dot layer 242.

The oxidation process is carried out in the second embodiment after the first stack body is formed. Alternatively, the oxidation process may be carried out after the positive electrodes 22 are formed. This alternative technique can equally diffuse oxygen in the first stack body side, to form the quantum-dot layer 242 containing the first quantum dots 71 and the second quantum dots 72.

It is inferred that the oxidation of the quantum-dot layer 242 proceeds by the same mechanism in the last alternative as in the first embodiment. Specifically, the diffusion in the multilayered structure of the oxygen in an external atmosphere is driven by a concentration gradient, to oxidize the quantum-dot layer 242. For instance, when the quantum-dot layer 242 is 50 nm thick, the hole transport layer 241 and the positive electrodes 22 are 30 nm and 80 nm thick respectively, it takes approximately 213 seconds to oxidize the entire quantum-dot layer 242 and thus render the quantum-dot layer 242 non-luminous. It is therefore estimated that it takes 151 seconds to oxidize up to half the thickness of the quantum-dot layer 242.

In the second embodiment, the stack body (quantum-dot layer 242) is formed in two steps: the stacking of the first stack body and the stacking of the second stack body. Alternatively, the stack body (quantum-dot layer 242) may be formed in three or more separate steps, in which case the oxidation process may be carried out after the second or subsequent stack body is formed.

Any of the elements described in the embodiments and variation examples may be used in proper combination so long as the combination works out well.

REFERENCE SIGNS LIST

1 Display Device
5 Light-emitting Element
22 Positive electrode
24 Functional Layer
25 Negative electrode
70 Quantum Dot
71 First Quantum Dot
72 Second Quantum Dot
81 First Ligand
82 Second Ligand
241 Hole Transport Layer
242 Quantum-dot Layer
243 Electron Transport Layer

The invention claimed is:

1. A light-emitting element comprising, on a substrate:
a positive electrode;
a negative electrode;
a quantum-dot layer between the positive electrode and the negative electrode, the quantum-dot layer including a stack of a plurality of luminous first quantum dots and a plurality of non-luminous second quantum dots;
a hole transport layer between the positive electrode and the quantum-dot layer; and
an electron transport layer between the negative electrode and the quantum-dot layer, wherein
a majority of second quantum dots in the plurality of second quantum dots are in an electron transport layer side compared to a hole transport layer side,
each of the plurality of first quantum dots has a first ligand on an outermost layer thereof,
each of the plurality of second quantum dots has a second ligand on an outermost layer thereof, and
the first ligand includes a number of carbon atoms per molecule that is equal to a number of carbon atoms per molecule in the second ligand.

2. The light-emitting element according to claim 1, wherein at least some of the majority of the second quantum dots in the plurality of second quantum dots are in contact with the electron transport layer.

3. The light-emitting element according to claim 1, wherein the plurality of second quantum dots has a lower conductivity than the plurality of first quantum dots.

4. The light-emitting element according to claim 1, wherein the first ligand on any one of the plurality of first quantum dots has a weight larger than a weight of the second ligand on any one of the plurality of second quantum dots.

5. The light-emitting element according to claim 1, wherein
the quantum-dot layer further includes a light-emitting layer of the plurality of first quantum dots and a non-light-emitting layer of the plurality of second quantum dots, and
the non-light-emitting layer resides in the hole transport layer side rather than in the electron transport layer side.

6. The light-emitting element according to claim 5, wherein the non-light-emitting layer is at most half as thick as the quantum-dot layer.

7. The light-emitting element according to claim 1, wherein the quantum-dot layer has a thickness less than or equal to 50 nm.

8. The light-emitting element according to claim 1, wherein the positive electrode resides between the negative electrode and the substrate.

9. The light-emitting element according to claim 1, wherein the negative electrode resides between the positive electrode and the substrate.

10. A display device comprising:
a thin film transistor; and
the light-emitting element according to claim 1, the light-emitting element being electrically connected to the thin film transistor.

* * * * *